United States Patent
Kawakami

(10) Patent No.: US 11,793,081 B2
(45) Date of Patent: Oct. 17, 2023

(54) VIBRATION POWER GENERATION ELEMENT

(71) Applicant: RESEARCH INSTITUTE FOR ELECTROMAGNETIC MATERIALS, Tomiya (JP)

(72) Inventor: Yoshihiro Kawakami, Tomiya (JP)

(73) Assignee: Research Institute for Electromagnetic Materials, Miyagi (JP)

( * ) Notice: Subject to any disclaimer, the term of this patent is extended or adjusted under 35 U.S.C. 154(b) by 0 days.

(21) Appl. No.: 18/016,715

(22) PCT Filed: Mar. 2, 2022

(86) PCT No.: PCT/JP2022/008981
§ 371 (c)(1),
(2) Date: Jan. 18, 2023

(87) PCT Pub. No.: WO2022/191011
PCT Pub. Date: Sep. 15, 2022

(65) Prior Publication Data
US 2023/0284535 A1 Sep. 7, 2023

(30) Foreign Application Priority Data
Mar. 9, 2021 (JP) .................. 2021-037801

(51) Int. Cl.
*H10N 30/30* (2023.01)
*H10N 30/853* (2023.01)
*H10N 30/87* (2023.01)

(52) U.S. Cl.
CPC ......... *H10N 30/306* (2023.02); *H10N 30/853* (2023.02); *H10N 30/871* (2023.02)

(58) Field of Classification Search
CPC ... H10N 30/306; H10N 30/871; H10N 30/853
(Continued)

(56) References Cited

U.S. PATENT DOCUMENTS 8,860,553 B2 * 10/2014 Lal .................. H03B 5/326
340/545.4
10,454,447 B2 10/2019 Solal et al.
(Continued)

FOREIGN PATENT DOCUMENTS

JP 2016-184805 A 10/2016
JP 2017-017939 A 1/2017
(Continued)

*Primary Examiner* — J. San Martin
(74) *Attorney, Agent, or Firm* — Carrier, Shonde & Associates P.C; Joseph P. Carrier; Fulchand P. Shende

(57) ABSTRACT

Provided is a vibration power generation element that can have improved property of piezoelectricity and mechanical robustness, while having a reduced cost. A piezoelectric layer (20) is formed on a substrate (10), which is supported on a support member (11) in a cantilever state, with a dielectric layer (102) interposed there between. A pair of comb electrodes (41, 42) are formed on the piezoelectric layer (20) that include comb portions (412, 422) extending in a direction (i.e., transverse direction) perpendicular to the extension direction (i.e., longitudinal direction) of the substrate 10 and disposed so as to be fitted into one another.

1 Claim, 3 Drawing Sheets

(58) Field of Classification Search
USPC .......................................................... 73/651
See application file for complete search history.

(56) References Cited

U.S. PATENT DOCUMENTS

2015/0076966 A1     3/2015  Cho et al.
2019/0189897 A1*    6/2019  Elata .................... H10N 30/208

FOREIGN PATENT DOCUMENTS

| JP | 2017090276 A | * | 5/2017 |
| JP | 2019-507546 A | | 3/2019 |
| JP | 6596310 B2 | * | 10/2019 |
| JP | 2022-010828 A | | 1/2022 |

* cited by examiner

VIBRATION POWER GENERATION ELEMENT

TECHNICAL FIELD

The present invention relates to a vibration power generation element.

BACKGROUND ART

There has been proposed a vibration power generation device configured to efficiently sense the vibration acceleration of a target frequency to be detected and also generate power with high efficiency (for example, see Patent Literature 1). Each of a plurality of power generation portions formed in respective vibrators supported on a frame portion includes a lower electrode, a piezoelectric thin film, and an upper electrode. A composite voltage of each voltage obtained between the lower electrode and the upper electrode according to vibration of each vibrator is output as an output voltage.

CITATION LIST

Patent Literature

Patent Literature 1: Japanese Patent Laid-Open No. 2017-017939

SUMMARY OF INVENTION

Technical Problem

In a piezoelectric vibration power generation element, if bulk piezoelectric ceramics are used for a piezoelectric body disposed on a vibration plate, the piezoelectric body is likely to be damaged due to bending deformation, which is problematic. Meanwhile, as a structure resistant against bending deformation, there is known a method of using a piezoelectric layer obtained by aligning the directions of polarization in a ferroelectric thin film. For a substrate for forming a piezoelectric layer, single-crystalline silicon that can be finely patterned is typically used. For a structure in which a piezoelectric layer is formed on a substrate, it is necessary to perform heating of the substrate and/or post-annealing at a high temperature, which are/is intended to improve crystallinity and grow the crystal grains, to improve the film properties. Therefore, Pt and/or platinum group alloy, which are/is chemically stable at high temperatures, are/is deposited as a lower electrode layer on the substrate. Typically, a piezoelectric layer is formed on the lower electrode, and an upper electrode is formed on the piezoelectric layer so as to obtain a structure in which the piezoelectric layer is sandwiched between the two electrodes.

However, when heating of the substrate and/or post-annealing are/is performed, noble metal, such as platinum (Pt) or palladium (Pd) alloy, is used for the lower electrode forming the power generation portion, resulting in an increased overall cost of the device. Meanwhile, when noble metal is not used for the lower electrode, the components of the substrate material and the components of the piezoelectric layer would diffuse around the interface during a heat treatment process, such as post-annealing, resulting in deteriorated property of piezoelectricity. Further, since a single-crystalline silicon substrate forming the piezoelectric layer is a brittle material, the piezoelectric layer is likely to be damaged due to bending deformation, which is problematic.

Accordingly, an object of the present invention is to provide a vibration power generation element that can have improved the property of piezoelectricity and mechanical robustness, while having a reduced cost.

Solution to Problem

A vibration power generation element of the present invention includes an elastically deformable substrate made of metal, the substrate being supported on a support member in a cantilever state and extending from the support member as a reference; a piezoelectric layer formed on the substrate with a dielectric layer interposed between the piezoelectric layer and the substrate; and a first comb electrode and a second comb electrode formed on the piezoelectric layer, in which the first comb electrode and the second comb electrode are disposed such that a plurality of first comb portions forming the first comb electrode and a plurality of second comb portions forming the second comb electrode are alternately adjacent to each other along an extension direction of the substrate, a width b of each of the first comb portions and the second comb portions is smaller than a thickness $t_1$ of the piezoelectric layer, a ratio $r=(\varepsilon_1/\varepsilon_2)$ of a dielectric constant $\varepsilon_1$ of the piezoelectric layer to a dielectric constant $\varepsilon_2$ of the dielectric layer is included in a range of 50 to 300, the thickness $t_1$ of the piezoelectric layer is included in a range of 10 to 50 μm, a thickness $t_2$ of the dielectric layer is included in a range of 1 to 3 μm, and a gap a between each of the first comb portions and each of the second comb portions is included in a range of greater than $2t_1$ and less than $t_1 + rt_2$.

According to the vibration power generation element with the foregoing structure, the dielectric layer is formed between the substrate and the piezoelectric layer (i.e., ferroelectric layer). This can prevent a component of an electric field in the piezoelectric layer in a direction parallel with the thickness direction from becoming the main component when a voltage is applied across the first comb electrode and the second comb electrode. Therefore, it is possible to, when an electric field sufficiently stronger than the coercive electric field of the piezoelectric layer is applied between each of the first comb portions and each of the second comb portions adjacent to each other on the piezoelectric layer, align the direction of spontaneous polarization in the piezoelectric layer with the planar direction perpendicular to the thickness direction of the piezoelectric layer or with the extension direction of the substrate.

Accordingly, the piezoelectric layer is allowed to function as a piezoelectric body in which the direction of polarization is aligned with the planar direction. When stress is applied to the piezoelectric layer in a direction parallel with the direction of polarization due to bending deformation of the metal substrate forming the cantilever, a voltage can be generated across the first comb electrode including the plurality of first comb portions and the second comb electrode including the plurality of second comb portions based on the longitudinal piezoelectric effect.

As described above, according to the vibration power generation element with the foregoing structure, a piezoelectric layer can be formed by forming electrodes only on the film surface of a ferroelectric layer. Thus, heat treatment can be performed without the need to use noble metal for the electrodes.

DESCRIPTION OF EMBODIMENTS (Structure)

Figure 1:
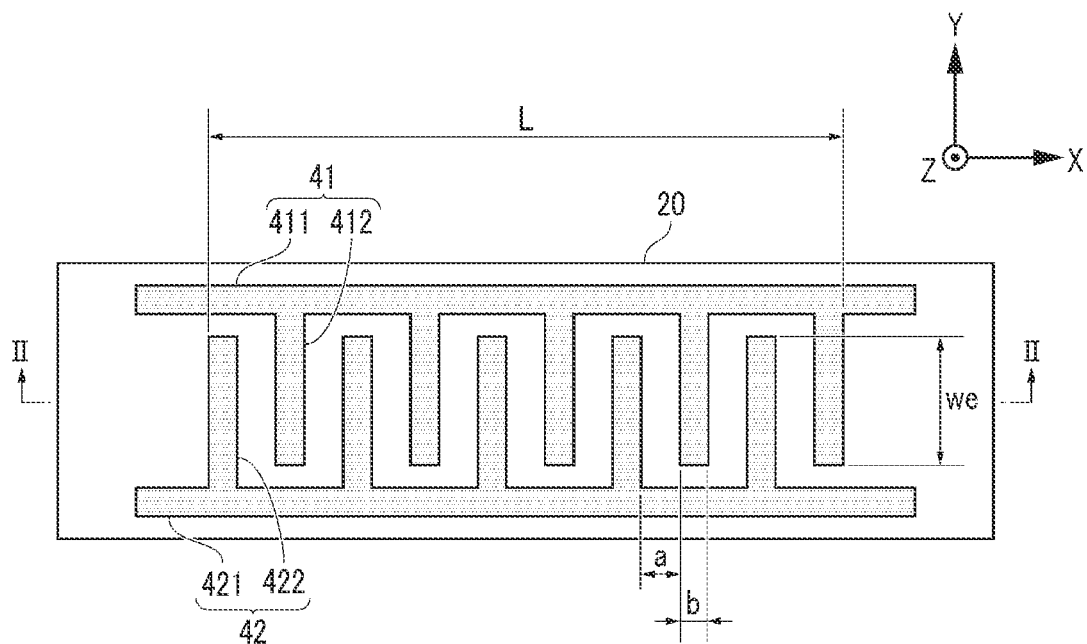
FIG. 1 is a top view of a vibration power generation element as an embodiment of the present invention.
Figure 2:
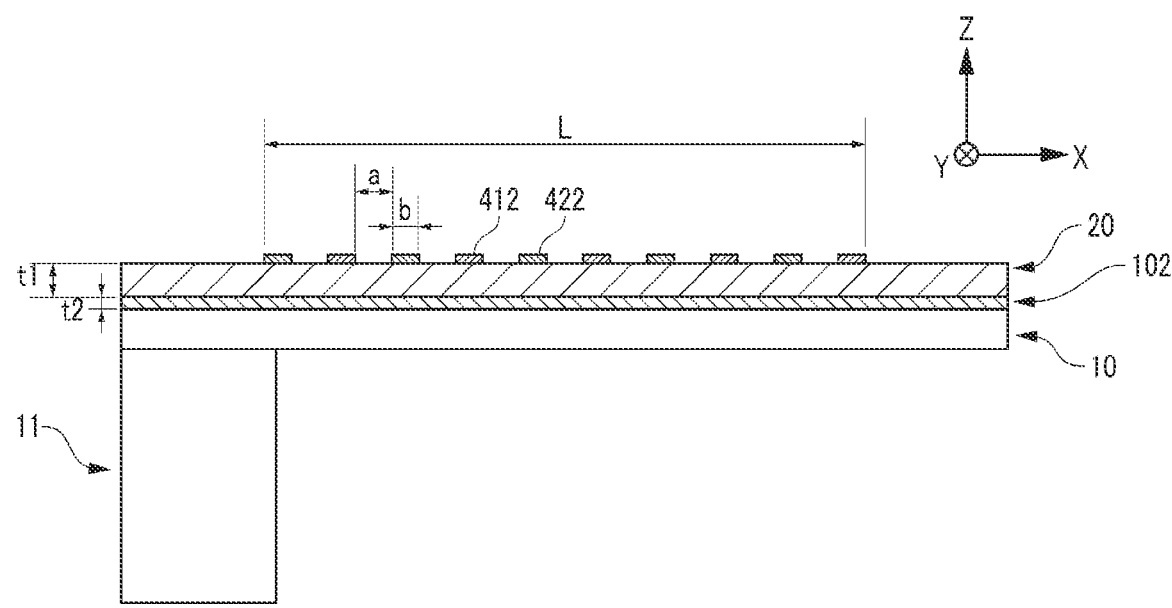
FIG. 2 is a cross-sectional view of the vibration power generation element along line II-II in FIG. 1.

A vibration power generation element illustrated in FIGS. 1 and 2 as an embodiment of the present invention includes a substrate 10, a piezoelectric layer 20 formed on the substrate 10 with a dielectric layer 102 interposed therebetween, and a first comb electrode 41 and a second comb electrode 42 each formed on the piezoelectric layer 20.

(Substrate)

The substrate 10 is a flexible or elastically deformable metal plate in a substantially rectangular plate shape with a thickness of 20 to 200 μm, for example. The substrate 10 is preferably made of heat-resistant stainless steel containing Al, and has formed on its surface the dielectric layer 102 that contains aluminum oxide ($Al_2O_3$) as the main component and has a thickness of greater than or equal to 1 μm. The dielectric layer 102 can, even when heat treatment is applied to the piezoelectric layer 20 together with the substrate 10, prevent the diffusion of the components of each of the substrate 10 and the piezoelectric layer 20.

(Fixation Method)

The substrate 10 in a substantially rectangular plate shape is joined to or bonded to a support member 11 at one end of its bottom surface (i.e., a main surface on a side opposite to another main surface on which the piezoelectric layer 20 is formed) so as to be supported on the support member 11 in a cantilever state, and extends in a first predetermined direction (i.e., X-direction) from the support member 11 as a reference. The support member 11 may include a mechanical fixation mechanism, such as a clamp made of resin for clamping the substrate 10 having the piezoelectric layer 20 formed thereon, or a base and a screw for attaching the substrate 10 to the base.

(Piezoelectric Material)

The piezoelectric layer 20 is preferably made of a lead-free piezoelectric ceramic material from the perspectives of the use application of the vibration power generation element when mounted on a living organism, and environmental burdens associated with the disposal of the vibration power generation element. For example, the piezoelectric layer 20 is made of a thin film of a lead-free piezoelectric material containing barium titanate ($BaTiO_3$), ($K_xNa_{1-x}$)$NbO_3$, ($Bi_{0.5}Na_{0.5}$)$TiO_3$, or ($Bi_{0.5}K_{0.5}$)$TiO_3$ as the main component.

(Structures of Piezoelectric Layer and Dielectric Layer)

The thickness $t_1$ of the piezoelectric layer 20 is adjusted to be within the range of 10 to 50 μm, for example. This is because if the thickness $t_1$ of the piezoelectric layer 20 is over 50 μm, mechanical fractures, such as cracks, are likely to occur in the piezoelectric layer 20 due to bending deformation of the substrate 10, and also because if the thickness $t_1$ of the piezoelectric layer 20 is less than 10 μm, the power generation energy would decrease.

It is preferable to form the dielectric layer 102 with a dielectric constant $\varepsilon_2$ lower than a dielectric constant $\varepsilon_1$ of the piezoelectric layer 20. This is to prevent an electric field component in the piezoelectric layer 20 in the thickness direction (i.e., Z-direction) from becoming the main component when a voltage is applied across the first comb electrode 41 and the second comb electrode 42 or between each of first comb portions 412 and each of second comb portions 422 adjacent to each other during the polarization treatment for the piezoelectric layer 20 so that the strength of an electric field in the piezoelectric layer 20 in the planar direction (i.e., direction parallel with the main surface) becomes equal to the coercive electric field $E_c$ of the piezoelectric layer 20.

Figure 3:
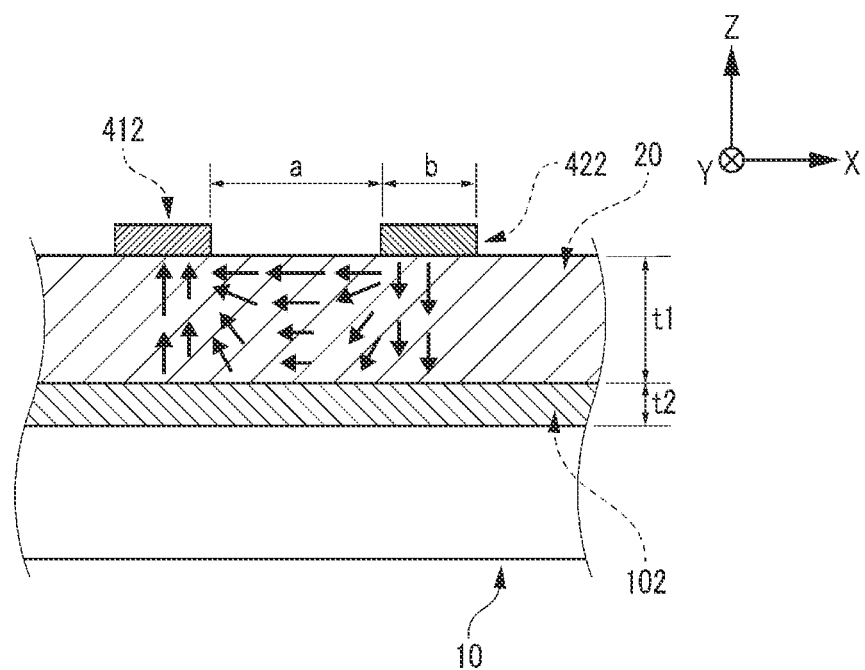
FIG. 3 is a schematic view illustrating an electric field in a piezoelectric layer when a voltage is applied across comb electrodes.

The thickness $t_2$ of the dielectric layer 102 is adjusted to be within the range of 1 to 3 μm. This is to facilitate the formation of the dielectric layer 102 while achieving the effect of controlling an electric field component. In FIG. 3, the direction of an electric field component in the piezoelectric layer 20 when a voltage is applied across each of the first comb portions 412 and each of the second comb portions 422 adjacent to each other is schematically shown by arrows pointing the direction.

(Description of Comb Electrodes)

The first comb electrode 41 includes a first base portion 411 extending in a direction in which the substrate 10 extends (i.e., +X-direction) from a portion of the substrate 10 supported by the support member 11 as a reference, and the plurality of first comb portions 412 extending from the first base portion 411 in a direction (i.e., -Y-direction) perpendicular to the extension direction of the substrate 10. The second comb electrode 42 includes a second base portion 421 extending in the direction in which the substrate 10 extends (i.e., +X-direction) from the portion of the substrate 10 supported by the support member 11 as a reference, and the plurality of second comb portions 422 extending from the second base portion 421 in a direction (i.e., +Y-direction) perpendicular to the extension direction of the substrate 10. Each of the first comb electrode 41 and the second comb electrode 42 is made of a conductor, such as metal. Each of the first comb electrode 41 and the second comb electrode 42 does not entirely cover the top surface of the piezoelectric layer 20. Thus, even when the first comb electrode 41 and/or the second comb electrode 42 are/is formed of noble metal, the cost of the material is not increased.

(Relational Expression of Piezoelectric Vibration Power Generation Energy and Dimension Parameters)

A relationship represented by Relational Expression (01) exists among the beam length L of the substrate 10, which is the length of the range of the plurality of first comb portions 412 and the plurality of second comb portions 422 that are present along the longitudinal direction (i.e., X-direction) of the substrate 10, the overlapping length $w_c$ of the first comb portions 412 and the second comb portions 422 along the transverse direction (i.e., Y-direction) of the substrate 10, the piezoelectric constant $d_{33}$ of the longitudinal piezoelectric effect of the piezoelectric layer 20, the thickness $t_1$ and the dielectric constant $\varepsilon_1$ of the piezoelectric layer 20, the dielectric constant $\varepsilon_0$ of a vacuum, the width b of each of the first comb portions 412 and the second comb portions 422, the gap a between each of the first comb portions 412 and each of the second comb portions 422, stress T applied to the piezoelectric layer 20 due to bending deformation of the substrate 10 along its extension direction, and power generation energy $U_{33}$ that depends on the potential difference between the first comb electrode 41 and the second comb electrode 42 according to the stress T.

$$U_{33} = \{d_{33}^2/2\varepsilon_1\varepsilon_0\}(w_c t_1 L)T^2\{a/(a+b)\} \quad (01).$$

Relational Expression (01) is an expression representing power generation energy based on the longitudinal piezoelectric effect since the substrate 10 has a cantilever structure in which stress is applied in a direction (i.e., second predetermined direction) parallel with the polarization axis of the piezoelectric layer 20.

(Case of Transverse Piezoelectric Effect)

Though not illustrated, a conventional vibration power generation element has a structure in which a piezoelectric layer is sandwiched between a pair of upper and lower electrodes, and the direction of polarization coincides with the thickness direction of the piezoelectric layer, while the direction of stress applied to the piezoelectric layer coincides with a direction perpendicular to the direction of polarization. Thus, such a vibration power generation element is a transverse piezoelectric effect element. Power generation energy based on the transverse piezoelectric effect is such that the piezoelectric constant in Relational Expression (01) is $d_{31}$, and the term a/(a+b) is not needed. Accordingly, the power generation energy $U_{31}$ is represented by Relational Expression (02).

$$U_{31} = \{d_{31}^2/(2\varepsilon_1\varepsilon_0)\}T^2(w_e t_1 L) \quad (02).$$

In the case of piezoelectric ceramics, there commonly exists a relationship of a piezoelectric constant: $d_{33} \approx 2 \times d_{31}$ from the relationship of the Poisson's ratio of the material. Thus, when the same stress is applied to the substrate 10 and the piezoelectric layer 20, in order to allow the power generation energy $U_{33}$ based on the longitudinal piezoelectric effect to be higher than the power generation energy $U_{31}$ based on the transverse piezoelectric effect, a relationship represented by an inequality: 4a/(a+b)>1 needs to be satisfied from Relational Expression (01) and Relational Expression (02). That is, in order to satisfy the relationship of $U_{33}>U_{31}$, a relationship represented by an inequality: b/a<3 needs to be satisfied between the electrode width b of each of the first comb portions 412 of the first comb electrode 41 and each of the second comb portions 422 of the second comb electrode 42 and the gap a between each of the first comb portions 412 and each of the second comb portions 422.

(Effects of Dielectric Layer)

Now, focus on the fact that the dielectric constant $\varepsilon_2$ of the dielectric layer 102 (i.e., diffusion barrier layer) when heat treatment is applied to the piezoelectric layer 20 formed on the substrate 10 is lower than the dielectric constant $\varepsilon_1$ of the piezoelectric layer 20. Thus, controlling the thickness $t_2$ of the dielectric layer 102 can allow the entire piezoelectric layer 20 formed on the substrate 10 to function as a longitudinal piezoelectric effect element.

The ratio $r=(\varepsilon_1/\varepsilon_2)$ of the dielectric constant $\varepsilon_1$ of the piezoelectric layer 20 to the dielectric constant $\varepsilon_2$ of the dielectric layer 102 is included in the range of 50 to 300. The width b of each of the first comb portions 412 and the second comb portions 422 (i.e., the size along the longitudinal direction of substrate 10) is smaller than the thickness $t_1$ of the piezoelectric layer 20.

During the polarization treatment for aligning the direction of polarization in the piezoelectric layer 20, which is formed on the main surface of the metal substrate 10 with the dielectric layer 102 interposed therebetween, with the in-plane direction (i.e., X-direction), a voltage is applied across the first comb electrode 41 and the second comb electrode 42 formed on the surface of the piezoelectric layer 20. At this time, a potential difference is also generated between each of the first comb electrode 41 and the second comb electrode 42 and the substrate 10. Therefore, it is necessary to align the direction of an electric field with the in-plane direction of the piezoelectric layer 20 between the first comb electrode 41 and the second comb electrode 42.

As the dielectric layer 102 is provided between the substrate 10 and the piezoelectric layer 20, the effective gap between the substrate 10 and each of the first comb electrode 41 and the second comb electrode 42 (or the effective thickness of the piezoelectric layer 20) is equal to (1+n) times the thickness $t_1$ of the piezoelectric layer 20 (where $n=(\varepsilon_1/t_1)(\varepsilon_2/t_2)$). That is, with the provision of the dielectric layer 102, the thickness $t_1$ of the piezoelectric layer 20 is apparently increased by (1+n) times. For example, when $(\varepsilon_1/\varepsilon_2)=50$, $t_1=50$ μm, and $t_2=1$ μm, the effective gap $(1+n)t_1$ between the substrate 10 and each of the comb electrodes 41 and 42 is twice the thickness $t_1$ of the piezoelectric layer 20 (n=1). Meanwhile, when $(\varepsilon_1/\varepsilon_2)=300$, $t_1=10$ μm, and $t_2=3$ μm, the effective gap $(1+n)t_1$ between the substrate 10 and each of the comb electrodes 41 and 42 is 91 times the thickness $t_1$ of the piezoelectric layer 20 (n=90).

According to FEM analysis, when the electrode width b is smaller than the thickness $t_1$ of the piezoelectric layer 20 and the electrode gap a is smaller than $2t_1$, an X-direction component $E_x$ of an electric field strength E between the first comb electrode 41 and the second comb electrode 42 becomes non-uniform depending on the depth from the top surface of the piezoelectric layer 20 (i.e., the interface between the piezoelectric layer 20 and each of the first comb electrode 41 and the second comb electrode 42). For example, it was confirmed that at an intermediate point between each of the first comb portions 412 and each of the second comb portions 422 adjacent to each other, X-direction components $E_{x(0.25)}$, $E_{x(0.50)}$, and $E_{x(0.75)}$ of the electric field E in the piezoelectric layer 20 at positions with depths of $0.25t_1$, $0.50t_1$, and $0.75t_1$ from the top surface of the piezoelectric layer 20 (i.e., the interface between the piezoelectric layer 20 and each of the first comb electrode 41 and the second comb electrode 42) are non-uniform. Herein, the term "non-uniform" means that $\max(E_{x(0.25)}, E_{x(0.50)}, E_{x(0.75)})/\min(E_{x(0.25)}, E_{x(0.50)}, E_{x(0.75)})$ is over 1.20.

Meanwhile, according to FEM analysis performed similarly, when the electrode width b is smaller than the thickness $t_1$ of the piezoelectric layer 20, and the electrode gap a is included in the range of greater than or equal to $2t_1$, the X-direction component $E_x$ of the electric field strength E between the first comb electrode 41 and the second comb electrode 42 is substantially uniform independently of the depth from the top surface of the piezoelectric layer 20 (i.e., the interface between the piezoelectric layer 20 and each of the first comb electrode 41 and the second comb electrode 42). Such a condition is represented by Relational Expression (11).

$$b < t_1 \leq a/2 \quad (11).$$

For example, it was confirmed that at an intermediate point between each of the first comb portions 412 and each of the second comb portions 422 adjacent to each other, the X-direction components $E_{x(0.25)}$, $E_{x(0.50)}$, and $E_{x(0.75)}$ of the electric field E in the piezoelectric layer 20 at positions with depths of $0.25t_1$, $0.50t_1$, and $0.75t_1$ from the top surface of the piezoelectric layer 20 (i.e., the interface between the piezoelectric layer 20 and each of the first comb electrode 41 and the second comb electrode 42) are non-uniform. Herein, the term "substantially uniform" means that $\max(E_{x(0.25)}, E_{x(0.50)}, E_{x(0.75)})/\min(E_{x(0.25)}, E_{x(0.50)}, E_{x(0.75)})$ is included in the range of 1.0 to 1.20.

Thus, under the condition of $b<t_1$, in order to uniformly align the direction of spontaneous polarization in the piezoelectric layer 20 with the thickness direction as well through the polarization treatment, it is acceptable as long as the electric field E between each of the first comb portions 412 and each of the second comb portions 422, which are adjacent to each other, is adjusted so that the strength of the X-direction component $E_x$ of the electric field E in the piezoelectric layer 20 becomes greater than or equal to the strength of the coercive electric field $E_c$.

Definition of Electric Field Strength E and Description of Electric Fields $E_x$ and $E_z$ When a voltage V is applied across the first comb electrode 41 and the second comb electrode 42, the electric field strength E between each of the first comb portions 412 and each of the second comb portions 422, which are adjacent to each other with the gap a therebetween along the longitudinal direction of the substrate 10, is V/a. Provided that a component of the electric field in the piezoelectric layer 20 in the thickness direction (i.e., Z-direction) is $E_z$, and a component of the electric field in the piezoelectric layer 20 in the longitudinal direction (i.e., X-direction) is $E_x$, the strength of the X-direction component $E_x$ of the electric field needs to be greater than or equal to the strength of the coercive electric field $E_c$ of the piezoelectric layer 20 from the perspective of aligning the direction of polarization in the piezoelectric layer 20 with the X-direction. $E_x$ and $E_z$ can be calculated through simulation using the finite element method.

Definition of Electric Field Strength Ratio R

Herein, as the X-direction component $E_x$ of the electric field E, the mean value of the X-direction components $E_x$ of the electric field at a plurality of portions in the piezoelectric layer 20 between each of the first comb portions 412 and each of the second comb portions 422 (for example, a plurality of portions with different depths from the surface of the piezoelectric layer 20 at an intermediate point between each of the first comb portions 412 and each of the second comb portions 422) is adopted. For example, as a condition for aligning the direction of polarization in the piezoelectric layer 20 with the X-direction, $E_x > E_c$, needs to be satisfied. When the electrode pattern has a comb shape, the strength of $E_x$ is smaller than that of E. Thus, in order to perform polarization treatment by setting $E_x$ greater than $E_c$, it is necessary to set the strength of E to be greater than that of an electric field in a structure in which a film is sandwiched between two electrodes.

To that end, as a production condition for applying $E_x$ with a sufficient strength, the electric field strength E is set three times that of $E_c$. In practice, an electric field strength E with a strength that is applied to the piezoelectric layer 102 without being discharged between the first comb electrode 41 and the second comb electrode 42 may be selected. The strength of $E_x$ varies depending on conditions, such as the dimensions of the electrode patterns of the comb electrodes, and the shape and the dimensions of the piezoelectric layer 102. Thus, it is necessary to determine the shapes of the electrodes and the piezoelectric layer 102 so as to allow $E_x$ to be greater than or equal to $E_c$. The electric field strength ratio $R=E_x/E$ is defined as follows. To satisfy the production condition of $E \geq 3 E_c$, a condition that the electric field strength ratio $R=E_x/E$ should be greater than or equal to ⅓ is adopted.

Herein, the gap a between each of the first comb portions 412 and each of the second comb portions 422 is designed smaller than the effective gap $(1+n)t_1$ between the substrate 10 and each of the comb electrodes 41 and 42 or $t_1 + r \cdot t_2$ (where $r=(\varepsilon_1/\varepsilon_2)$). Such a condition is represented by Relational Expression (12).

$$a < (1+n)t_1 = t_1 + r \cdot t_2 \tag{12}$$

This is because when the gap a between each of the first comb portions 412 and each of the second comb portions 422 is greater than or equal to the effective gap $(1+n)t_1$ between the substrate 10 and each of the comb electrodes 41 and 42, the electric field strength ratio $R=(E_x/E)$, which is the ratio of the strength of the X-direction component $E_x$ to the electric field strength E between the first comb electrode 41 and the second comb electrode 42, is less than ⅓.

(Production Method)

A method for producing the vibration power generation element as an embodiment of the present invention will be described.

(Film Deposition Based on AD Method)

For example, lead-free piezoelectric ceramic powder with a particle size of about 1 μm, specifically, barium titanate ($BaTiO_3$) powder is injected from a nozzle onto the substrate 10 in a substantially rectangular plate shape, which is made of heat-resistant stainless steel containing Al, in a vacuum, and thus is caused to impinge on the substrate 10, whereby a film is formed through aerosol deposition (AD). With the AD method, the piezoelectric layer 20 with a desired thickness of 10 to 50 μm is formed.

(Flexibility and Adhesion Strength of AD Film)

The film formed with the AD method (i.e., as-deposited film) is firmly joined to the substrate 10 due to the anchoring effect. Such firm joining is maintained even with the piezoelectric layer 20 in the final state. This can reduce the possibility of cracking of the piezoelectric layer 20 or peeling of the piezoelectric layer 20 off the substrate 10 when the vibration power generation element is deformed due to bending. Thus, the AD method is a method suitable for obtaining the flexible piezoelectric layer 20.

(Adjustment of Crystal Grain Size of Piezoelectric Layer)

The microstructure of the as-deposited film has a size smaller than the particle size of the powder used for the AD method, and has a size reduced to about several ten nm. Thus, since the as-deposited film has a low piezoelectric property, it is necessary to promote the growth of the crystal grains through heat treatment. Meanwhile, since damage to ceramics typically occurs at a grain boundary face, in order to increase the strength of the piezoelectric layer 20, it would be desirable to use a microcrystal structure with many grain boundary faces. Heat treatment is applied to the as-deposited film at 800 to 1200° C. for one to four hours so that the average grain size of the crystals forming the resulting piezoelectric layer 20 becomes greater than or equal to 100 nm from the perspective of improving the piezoelectric property, and so that the average grain size of the crystals forming the resulting piezoelectric layer 20 becomes less than or equal to 2000 nm from the perspective of securing the strength of the piezoelectric layer 20.

(Formation of Dielectric Layer (i.e., Diffusion Barrier Layer))

The dielectric layer 102 containing Al oxide ($Al_2O_3$) as the main component is formed between the substrate 10 and the piezoelectric layer 20 in a heat treatment step. Accordingly, the dielectric layer 102 functions as a diffusion barrier layer for suppressing the diffusion of components between the substrate 10 made of stainless steel and the piezoelectric layer 20, and thus can avoid a circumstance that the substrate 10 and the piezoelectric layer 20 react with each other when heat treatment at a temperature as high as 900° C. or greater is applied. It is also possible to form the dielectric layer 102 with a thickness of greater than or equal to 1 μm in advance on the main surface of the substrate 10 made of stainless steel, or form the piezoelectric layer 20 directly on the main surface of the substrate 10 made of stainless steel containing Al, and then apply heat treatment to the piezoelectric layer 20 so as to form the dielectric layer 102.

(Formation of Comb Electrodes)

The first comb electrode 41 and the second comb electrode 42 are formed on the piezoelectric layer 20 subjected to the heat treatment. Each of the first comb electrode 41 and the second comb electrode 42 is made of a conductive film, and has a thickness of 0.4 to 0.6 μm, for example. The conductive film can be formed using the sputtering method or the vapor deposition method, for example. Each of the first comb electrode 41 and the second comb electrode 42 is not limited to an Au film, and may be other metal films, such as a Cu film or a Cu alloy film, or a multilayered film, such as Au/Ni/Ti.

(Polarization Treatment)

The as-deposited film as well as the post-heat treatment film obtained by applying heat treatment to the as-deposited film has a polycrystalline structure. Thus, the directions of electric polarization in the film are random. Therefore, to align the directions of polarization, a voltage (i.e., a predetermined voltage) with a level greater than or equal to the electric field strength that causes polarization reversal is applied to the post-heat treatment film between the first comb electrode 41 and the second comb electrode 42. When the dielectric layer 102 is not formed between the substrate 10 and the piezoelectric layer 20 and when the thickness $t_2$ of the dielectric layer 102 is extremely smaller than the thickness $t_1$ of the piezoelectric layer 20, a component of an electric field in the piezoelectric layer 20 in the thickness direction (i.e., Z-direction) is likely to become the main component. Thus, the thickness $t_2$ of the dielectric layer 102 is desirably greater than or equal to 1 μm. Setting the dielectric constant $\varepsilon_2$ of the dielectric layer 102 (i.e., diffusion barrier layer) to be lower than the dielectric constant $\varepsilon_1$ of the piezoelectric layer 20 allows a component of an electric field in the piezoelectric layer 20 in the planar direction or in a second predetermined direction (i.e., a Y-direction component) to become the main component.

To form the dielectric layer 102 with a thickness of greater than 3 μm on the main surface of the substrate 10 made of metal, such as stainless steel, it would be unrealistic to use a thin film forming method, which has a low deposition rate, from the perspective of production efficiency. With a thick film forming method, such as the AD method, it is possible to form the dielectric layer 102 with a thickness of greater than 3 μm. However, it would be more effective to form the piezoelectric layer 20 thick than forming the dielectric layer 102 thick for improving performance from the perspective of improving the power generation energy. Therefore, the thickness of the dielectric layer 102 was adjusted to less than or equal to 3 μm. In addition, when a stainless steel substrate containing Al is used for the method of forming the dielectric layer 102, the dielectric layer 102 can be formed through thermal oxidation of Al contained in the substrate. Applying heat treatment to the piezoelectric layer 102 can also grow the film thick, and also exerts the effect of improving the adhesion strength between the piezoelectric layer 102 and the dielectric layer 20.

Accordingly, a vibration power generation element as an embodiment of the present invention is produced (see FIGS. 1 and 2).

REFERENCE SIGNS LIST

10 Substrate
11 Support member
20 Piezoelectric layer (ferroelectric layer)
41 First comb electrode
42 Second comb electrode
102 Dielectric layer (diffusion barrier layer)
411 First base portion
412 First comb portion
421 Second base portion
422 Second comb portion

The invention claimed is:

1. A vibration power generation element comprising:
an elastically deformable substrate made of metal, the substrate being supported on a support member in a cantilever state and extending from the support member as a reference;
a piezoelectric layer formed on the substrate with a dielectric layer interposed between the piezoelectric layer and the substrate; and
a first comb electrode and a second comb electrode formed on the piezoelectric layer,
wherein:
the first comb electrode and the second comb electrode are disposed such that a plurality of first comb portions forming the first comb electrode and a plurality of second comb portions forming the second comb electrode are alternately adjacent to each other along an extension direction of the substrate,
a width b of each of the first comb portions and the second comb portions is smaller than a thickness $t_1$ of the piezoelectric layer,
a ratio $r=(\varepsilon_1/\varepsilon_2)$ of a dielectric constant $\varepsilon_1$ of the piezoelectric layer to a dielectric constant $\varepsilon_2$ of the dielectric layer is included in a range of 50 to 300,
the thickness $t_1$ of the piezoelectric layer is included in a range of 10 to 50 μm,
a thickness $t_2$ of the dielectric layer is included in a range of 1 to 3 μm, and
a gap a between each of the first comb portions and each of the second comb portions is included in a range of greater than $2t_1$ and less than $t_1+rt_2$.

* * * * *